(12) United States Patent
Garg et al.

(10) Patent No.: US 7,725,792 B2
(45) Date of Patent: May 25, 2010

(54) DUAL-PATH, MULTIMODE SEQUENTIAL STORAGE ELEMENT

(75) Inventors: Manish Garg, Morrisville, NC (US); Fadi Adel Hamdan, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 1120 days.

(21) Appl. No.: 11/365,716

(22) Filed: Mar. 1, 2006

(65) Prior Publication Data
US 2007/0208912 A1 Sep. 6, 2007

(51) Int. Cl.
*G01R 31/28* (2006.01)
(52) U.S. Cl. .................................. 714/729; 714/734
(58) Field of Classification Search ................ 714/724, 714/726, 727, 729, 733, 734
See application file for complete search history.

(56) References Cited

U.S. PATENT DOCUMENTS

| | | | |
|---|---|---|---|
| 5,378,934 A | 1/1995 | Takahashi et al. | |
| 5,424,654 A | 6/1995 | Kaplinsky | |
| 5,572,539 A * | 11/1996 | Kondo | 372/45.01 |
| 5,617,549 A * | 4/1997 | DeLano | 712/206 |
| 6,242,269 B1 * | 6/2001 | Whetsel | 438/11 |
| 6,301,171 B2 * | 10/2001 | Kim et al. | 365/189.02 |
| 6,438,720 B1 * | 8/2002 | Boutaud et al. | 714/724 |
| 6,662,324 B1 * | 12/2003 | Motika et al. | 714/726 |
| 7,102,406 B2 * | 9/2006 | Ishihara | 327/200 |
| 7,355,430 B2 * | 4/2008 | Whetsel | 324/763 |
| 7,535,772 B1 * | 5/2009 | Parameswaran et al. | 365/189.02 |

OTHER PUBLICATIONS

"Test volume reduction via flip-flop compatibility analysis for balanced parallel scan" by Ashouei et al. This paper appears in: Current and Defect Based Testing, 2004. DBT 2004. Proceedings. 2004 IEEE International Workshop on Publication Date: Apr. 25, 2004 On pp. 105-109 ISBN: 0-7803-8950-6 INSPEC Accession No. 8332514.*
"A new approach for massive parallel scan design" by Woo Cheol Chung Ha, D.S. This paper appears in: Test Conference, 2005. Proceedings. ITC 2005. IEEE International Publication Date: Nov. 8-8, 2005 On p. 10 pp. -506 ISBN: 0-7803-9035-5 INSPEC Accession No. 9004567.*

(Continued)

*Primary Examiner*—Cynthia Britt
(74) *Attorney, Agent, or Firm*—Nicholas J. Pauley; Peter Kamarchik; Sam Talpalatsky

(57) ABSTRACT

A dual-path, multimode sequential storage element (SSE) is described herein. In one example, the dual-path, multimode SSE comprises first and second sequential storage elements, a data input, a data output, and a selector mechanism. The first and second sequential storage elements each have an input and an output. The data input is coupled to the inputs of both sequential storage elements and is configured to accept data. The data output is coupled to the outputs of both sequential storage elements and is configured to output the data. The selector mechanism is configured to select one of the sequential storage elements for passing the data from the data input to the data output. In one example, the first sequential storage element comprises a pulse-triggered storage element and the second sequential storage element comprises a master-slave storage element.

27 Claims, 9 Drawing Sheets

OTHER PUBLICATIONS

"Digital Fundamentals" by Floyd, McMillan Publishing Company 1994 p. 389.*

Mitra, S. et al.; Robust System Design wit Built-In Soft-Error Resilience; Computer, IEEE Service Center, Los Alamitos, CA; Feb. 1, 2005; pp. 43-52; XP002378078' OSSM 0018-9162.

International Preliminary Report on Patentability-PCT/US07/063104, The Internnational Bureau of WIPO, Geneva Switzerland—Sep. 2, 2008.

International Search Report-PCT/US07/063104, International Search Authority-European Patent Office—Jul. 16, 2007.

Written Opinion-PCT/US07/063104, International Search Authority-European Patent Office—Jul. 16, 2007.

* cited by examiner

DUAL-PATH, MULTIMODE SEQUENTIAL STORAGE ELEMENT

FIELD

The present disclosure generally relates to sequential storage elements, and particularly relates to storing data in dual-path, multimode sequential storage elements.

BACKGROUND

High-performance integrated circuits, particularly microprocessors commonly provide various modes of operation, e.g., high performance, low power, standby, or test modes. Microprocessors may operate in a high-performance mode when tasked with timing-critical applications. Some microprocessors incorporate pulse-triggered storage elements, e.g., pulse-triggered latches, registers, or flip-flops to improve performance when executing instructions associated with timing-critical applications. For example, pulse-triggered storage elements may be dispersed throughout instruction execution pipelines for improving data transfer speed between pipeline stages. Pulse-triggered storage elements capture and/or launch data in response to a pulse clock signal, i.e., a clock signal having a pulse width less than half of the clock period.

Conventional pulse-triggered storage elements trade-off performance for stability. That is, pulse-triggered storage elements offer improved performance in that only a single latch stage exists between the storage element input and output. Conversely, conventional master-slave storage elements comprise two latch stages through which input data passes before reaching the output. However, pulse-triggered storage elements are commonly not as stable as master-slave storage elements over a wide range of process variation and/or operating conditions.

The short sampling window associated with pulse-triggered storage elements causes pulse-triggered storage elements to be more sensitive to variations in process parameters and/or operating conditions. For example, pulse-triggered storage elements are more sensitive than master-slave storage elements to variations in process parameters such as transistor threshold voltage, channel length, and gate oxide thickness. Additionally, pulse-triggered storage elements are more sensitive to variations in operating conditions such as dynamically varied supply voltages, power supply drift, temperature changes, high radiation flux (causing soft errors) and the like.

Further, integrated circuits incorporating pulse-triggered storage elements, e.g., microprocessors may be operated in timing insensitive modes such as low power, standby, or test modes. When configured in an operating mode that is timing insensitive, pulse-triggered storage elements included in a microprocessor may not function properly. For example, in low power mode, the operating voltage may be lowered to such a value that the pulses would become either too narrow or too wide for reliable circuit operation.

As such, pulse-triggered storage elements are conventionally used in applications where performance is critical and variations in process parameters and/or operating conditions are minimal or may be maintained within acceptable limits. Otherwise, master-slave storage elements are conventionally used in applications where reliable operation is desired over a wide range of process variation and/or operating conditions.

SUMMARY OF THE DISCLOSURE

According to the methods and apparatus taught herein, a dual-path, multimode sequential storage element (SSE) is presented. In one or more embodiments, the dual-path, multimode SSE comprises first and second sequential storage elements, a data input, a data output, and a selector mechanism. The first and second sequential storage elements each have an input and an output. The data input is coupled to the inputs of both sequential storage elements and is configured to accept data. The data output is coupled to the outputs of both sequential storage elements and is configured to output the data. The selector mechanism is configured to select one of the sequential storage elements for passing the data from the data input to the data output. In one example, the first sequential storage element comprises a pulse-triggered storage element and the second sequential storage element comprises a master-slave storage element. Thus, in at least one embodiment, data is stored in a dual-path, multimode SSE by selecting one of a master-slave storage element and a pulse-triggered storage element coupled in parallel responsive to a mode input and passing data from a data input to a data output via the selected storage element.

Corresponding to the above dual-path, multimode SSE apparatuses and methods, a complementary microprocessor comprises a clock control circuit, a plurality of pipelines and inter-stage dual-path multimode SSEs. The clock control circuit is configured to activate one of a pulse clock signal and a phase clock signal. Each pipeline has a plurality of stages separated by the inter-stage dual-path multimode SSEs. Each dual-path multimode SSE comprises a master-slave storage element, a pulse-triggered storage element, a data input, a data output, and a selector mechanism. The master-slave and pulse-triggered storage elements each have an input and an output. The data input is coupled to the inputs of both storage elements and is configured to accept data. The data output is coupled to the outputs of both storage elements and is configured to output the data. The selector mechanism is configured to select one of the sequential storage elements for passing the data from the data input to the data output responsive to the clock signal activated by the clock control circuit.

Of course, the present disclosure is not limited to the above features. Those skilled in the art will recognize additional features upon reading the following detailed description, and upon viewing the accompanying drawings.

DETAILED DESCRIPTION

Figure 1:
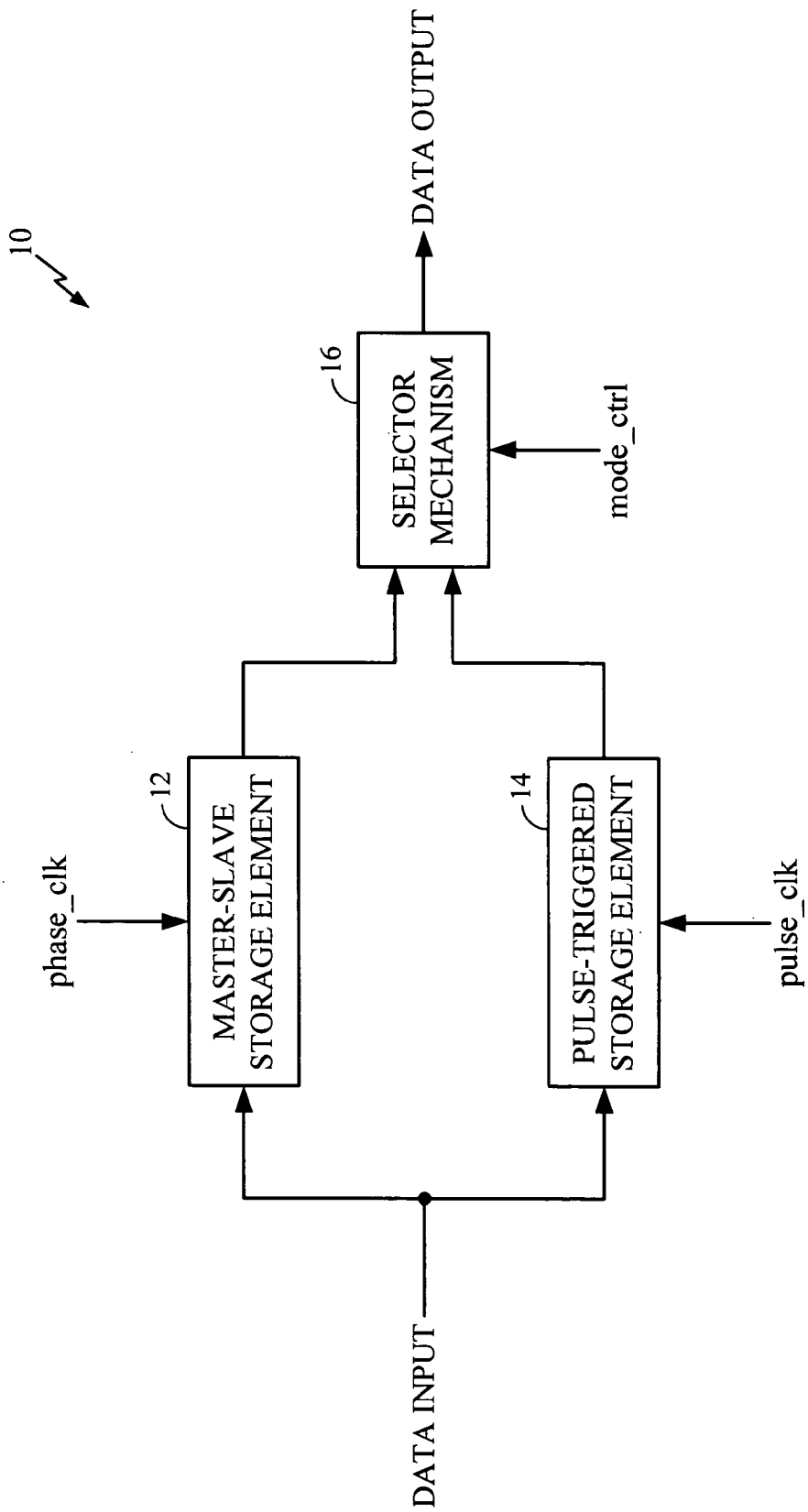
FIG. 1 is a block diagram of an embodiment of a dual-path, multimode sequential storage element (SSE).

FIG. 1 illustrates an embodiment of a dual-path, multimode Sequential Storage Element (SSE) 10. The dual-path, multimode SSE 10 has two parallel paths, each path capable of storing data. During operation, one of the parallel paths is selected or enabled to pass data from a data input to a data output of the dual-path, multimode SSE 10. The data input of the dual-path, multimode SSE 10 accepts or receives data from logic or circuitry (not shown) coupled to the SSE 10. The data output of the dual-path, multimode SSE 10 makes available or outputs data stored by the SSE 10 to the same or different logic or circuitry.

In a non-limiting example, one path of the dual-path, multimode SSE 10 is a low-performance path comprising a master-slave storage element 12, e.g., a master-slave latch, flip-flop or register. The other path is a high-performance path comprising a pulse-triggered storage element 14, e.g., a pulse-triggered latch, flip-flop or register. The dual-path, multimode SSE 10 further includes a selector mechanism 16, e.g., a multiplexer circuit for enabling or selecting one of the paths through which data passes from the data input to the data output of the SSE 10 in response to a mode control signal (mode_ctrl).

Latency associated with the dual-path, multimode SSE 10 is reduced by selecting the pulse-triggered storage element 14, thus optimizing the performance of the SSE 10. As such, the pulse-triggered storage element 14 may be selected when performance is critical or when process parameters (e.g., transistor threshold voltage, channel length, and gate oxide thickness) and/or operating conditions (e.g., dynamically varied supply voltages, power supply drift, temperature changes, and variations in radiation flux) are within acceptable limits such that the pulse-triggered storage element 14 is expected to function reliably. Conversely, when the master-slave storage element 12 is selected, the reliability of the dual-path, multimode SSE 10 is optimized. That is, because the master-slave storage element 12 provides reliable operation over a wide range of process variation and/or operating conditions, the master-slave storage element 12 provides optimized reliability, albeit at reduced performance as compared to the pulse-triggered storage element 14. As such, the master-slave storage element 12 may be selected when performance is not critical or when process parameters and/or operating conditions are outside acceptable limits such that the pulse-triggered storage element 14 is not expected to function reliably. Thus, the dual-path, multimode SSE 10 is capable of selectively switching between high-performance and optimized-reliability data storage paths in response to a particular application or environment in which the SSE 10 is being used.

The pulse-triggered storage element 14 stores and passes data from the data input to the data output of the dual-path, multimode SSE 10 in response to a pulse clock signal (pulse_clk), i.e., a clock signal having a pulse width less than half of the clock period. When the pulse clock is inactive, the pulse-triggered storage element 14 is effectively disabled. Similarly, the master-slave storage element 12 stores and passes data from the data input to the data output of the SSE 10 in response to a phase clock signal (phase_clk), i.e., a clock signal having a pulse width approximately half of the clock period. Likewise, when the phase clock is inactive, the master-slave storage element 12 is effectively disabled. The pulse and phase clocks are activated in response to a mode control signal as described in detail later.

Figure 2:
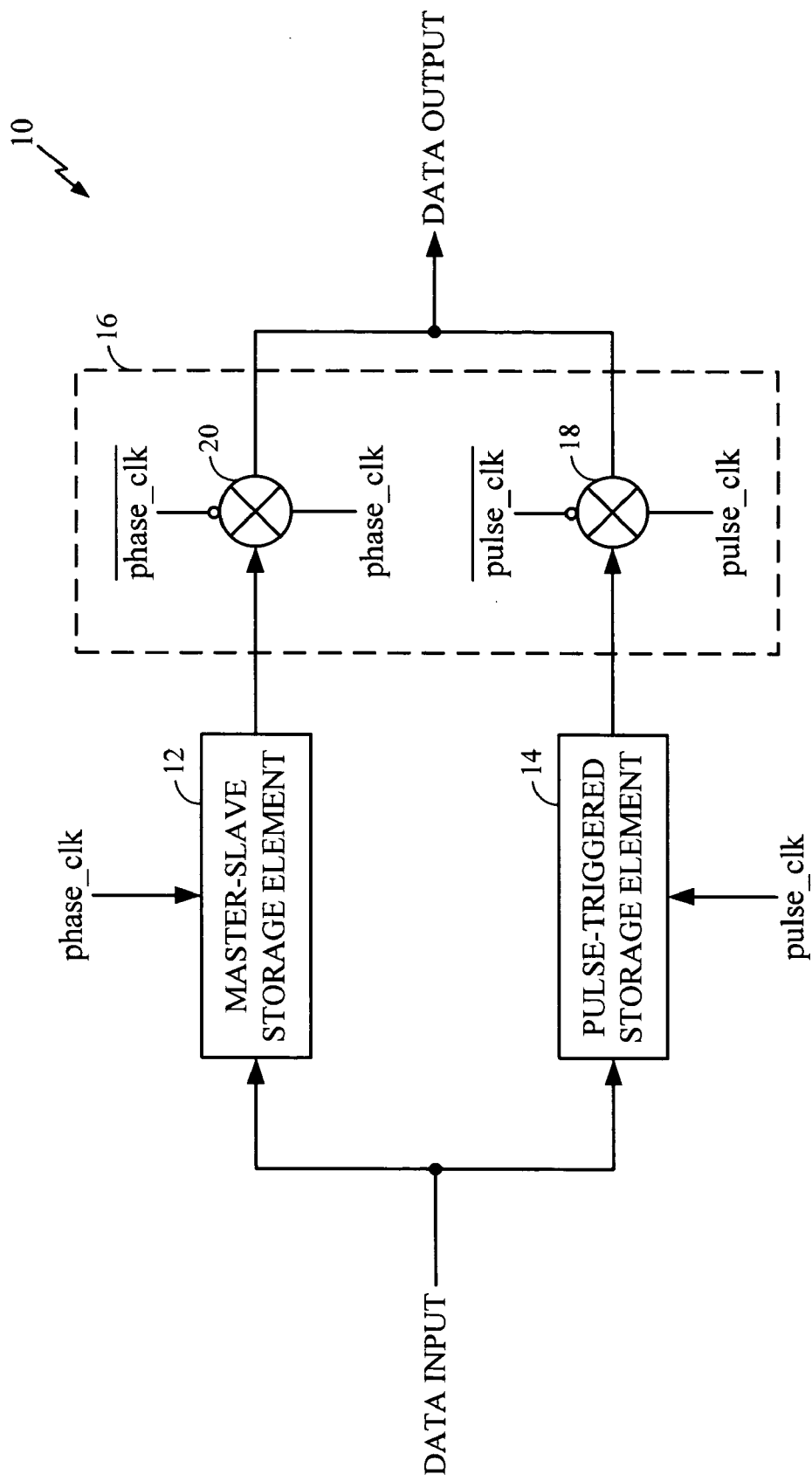
FIG. 2 is a block diagram of another embodiment of a dual-path, multimode SSE.

FIG. 2 illustrates an embodiment of the dual-path, multimode SSE 10 wherein the selector mechanism 16 comprises transmission or pass gates. Particularly, the selector mechanism 16 comprises a first transmission gate 18 interposed between the pulse-triggered storage element 14 and the data output of the dual-path, multimode SSE 10 and a second transmission gate 20 interposed between the master-slave storage element 12 and the data output of the SSE 10.

The first transmission gate 18 may be enabled in response to the pulse clock signal (pulse_clk) that triggers or clocks the pulse-triggered storage element 14. As such, the first transmission gate 18 permits the pulse-triggered storage element 14 to pass data from the data input to the data output of the dual-path, multimode SSE 10 in response to a pulse clock signal. Conversely, when the pulse clock signal is inactive, the first transmission gate 18 is disabled, thus preventing data from passing between the data input and the data output of the SSE 10 via the pulse-triggered storage element 14. Alternatively, the transmission gate 18 may be directly controlled by a mode control signal.

The second transmission gate 20 is enabled in response to the phase clock signal (phase_clk) that triggers or clocks the master-slave storage element 12. As such, the second transmission gate 20 permits the master-slave storage element 12 to pass data from the data input to the data output of the dual-path, multimode SSE 10 in response to a phase clock signal. When the phase clock signal is inactive, the second transmission gate 20 is disabled, thus preventing data from passing between the data input and the data output of the SSE 10 via the master-slave storage element 12. Alternatively, the second transmission gate 20 may be directly controlled by the mode control signal.

Further, the outputs of the transmission gates 18, 20 are coupled in a wired-OR configuration to the data output of the dual-path, multimode SSE 10. As such, the outputs of the transmission gates 18, 20 are logically dotted or combined together to form an output signal, thus only marginally increasing the overall delay associated with the SSE 10 by the latency associated with the wired-OR configuration.

Figure 3:
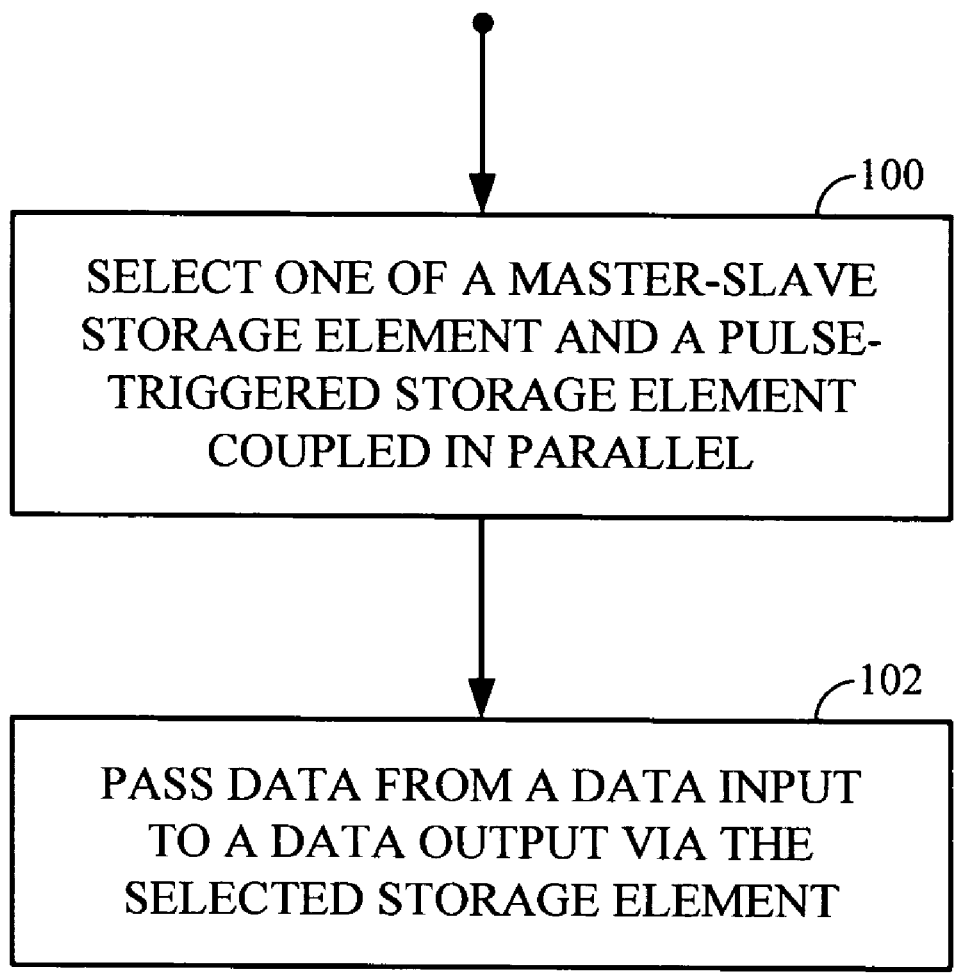
FIG. 3 is a logic flow diagram illustrating program logic for storing data in a dual-path, multimode SSE.

With the above in mind, FIG. 3 illustrates corresponding program logic for storing data in the dual-path, multimode SSE 10. Processing "begins" with selecting either the master-slave storage element 12 or the pulse-triggered storage element 14 (Step 100). In one example, the dual-path, multimode SSE 10 includes a multiplexer circuit for selecting one of the storage elements 12, 14. In another example, the dual-path, multimode SSE 10 includes the transmission gates 18, 20 for selecting one of the storage elements 12, 14. Regardless of the particular selector mechanism, input data is then passed from a data input to a data output of the dual-path, multimode SSE 10 via the selected storage element (Step 102).

Figure 4:
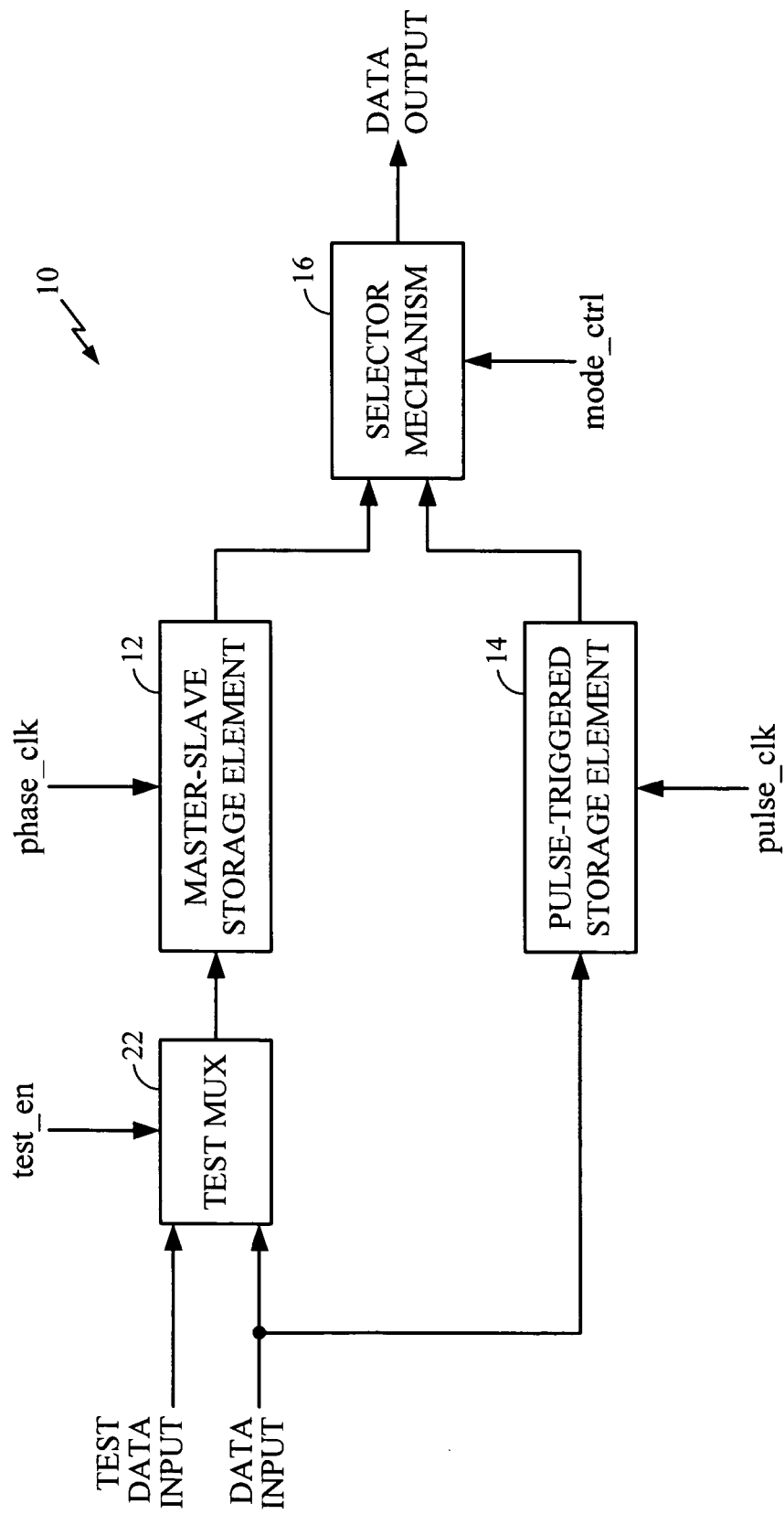
FIG. 4 is a block diagram of yet another embodiment of a dual-path, multimode SSE.

FIG. 4 illustrates another embodiment of the dual-path, multimode SSE 10, wherein the SSE 10 further includes circuitry for making the SSE 10 compatible with one or more testing methodologies. In one example, the dual-path, multimode SSE 10 further includes a test multiplexer circuit 22. The test multiplexer circuit 22 couples the master-slave storage element 12 of the SSE 10 either to a test data input or to the normal functional data input in response to a test enable signal (test_en). During testing, the test enable signal causes the test multiplexer circuit 22 to select the test data input. As such, test data is captured and/or launched by the master-slave storage element 12 during testing operations. During non-testing operations, the test enable signal is de-asserted. In response, the test multiplexer circuit 22 couples the master-slave storage element 12 to the normal functional data input. Thus, the dual-path, multimode SSE 10 is fully compatible with scan-based testing methodologies. Further, the test multiplexer circuit 22 increases the latency associated with only the low-performance path of the SSE 10, which includes the master-slave storage element 12. Because the low-performance path of the SSE 10 may be active during timing insensitive operations or when optimized reliability is more critical than increased performance, the performance impact resulting from the added latency of the test multiplexer circuit 22 is acceptable. As such, the performance of the high-performance path of the SSE 10, which includes the pulse-triggered storage element 14, is not adversely affected by inserting the test multiplexer circuit 22 into the low-performance path of the SSE 10.

Figure 5:
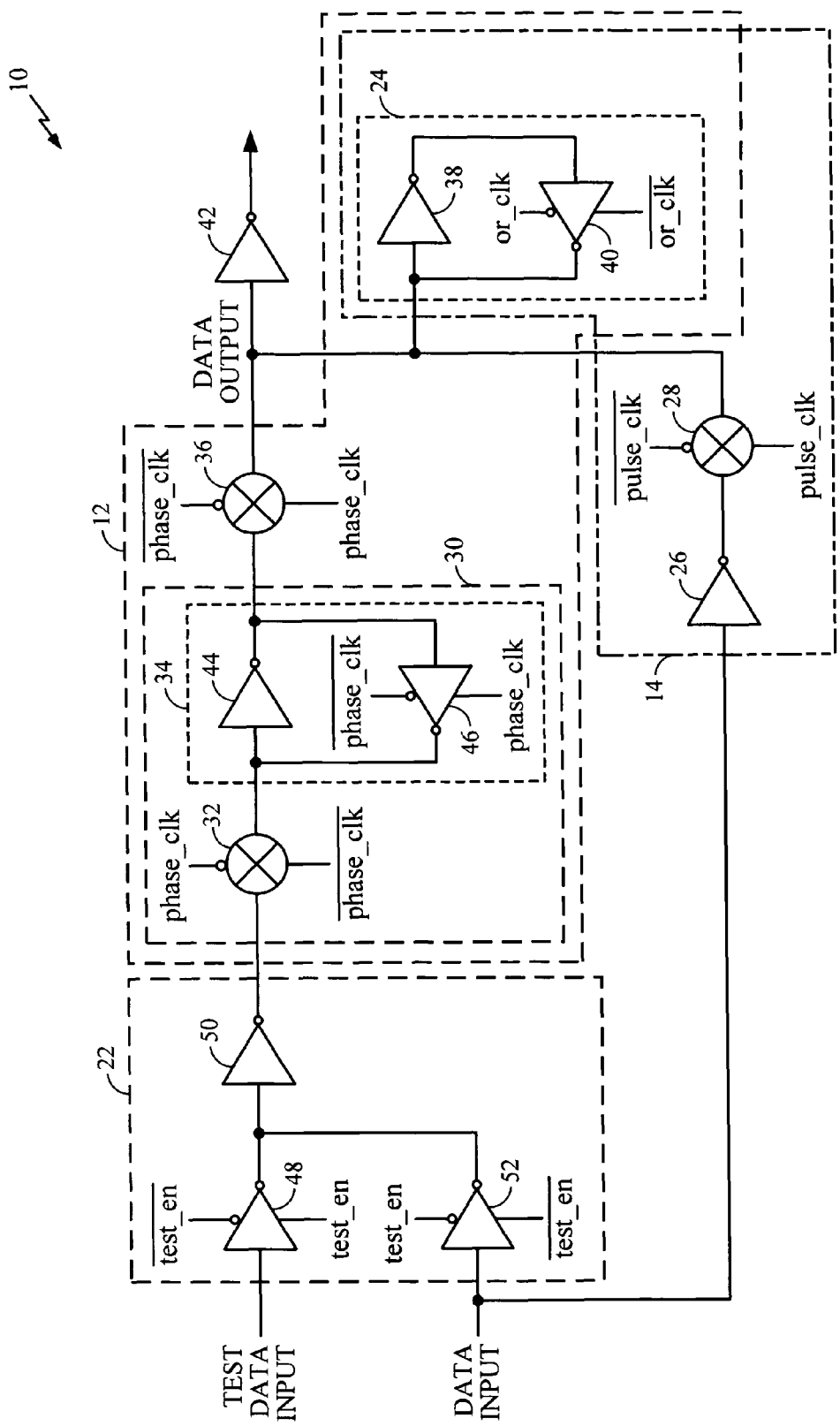
FIG. 5 is a circuit diagram of an embodiment of a dual-path, multimode SSE.

FIG. 5 illustrates an exemplary circuit implementation of the dual-path, multimode SSE 10. In this particular embodiment, the master-slave storage element 12 and the pulse-triggered storage element 14 share a keeper circuit 24. Particularly, the shared keeper circuit 24 functions as a data storage element for both storage elements 12, 14. The pulse-triggered storage element 14 comprises a buffer circuit 26, a transmission gate 28 and the shared keeper circuit 24. The master-slave storage element 12 comprises a master stage 30 including a transmission gate 32 and a keeper circuit 34 and a slave stage including a transmission gate 36 and the shared keeper circuit 24.

The shared keeper circuit 24, comprising a buffer 38 and a tri-state buffer 40, stores data captured by either of the sequential storage elements 12, 14. The shared keeper circuit 24 is enabled after data is captured by one of the storage elements 12, 14. Conversely, when one of the storage elements 12, 14 is in the process of capturing data, the shared keeper circuit 24 is disabled to prevent signal contention. Particularly, when one of the storage elements 12, 14 is capturing data, either the pulse clock signal (pulse_clk) or phase clock signal (phase_clk) has an active clock cycle period. During active clock cycle periods, the shared keeper circuit 24 is disabled in response to the or_clk signal, thus preventing signal contention during data capture. After data capture is complete and the corresponding clock signal enters an inactive clock cycle period, the shared keeper circuit 24 is enabled in response to the or_clk signal, thus causing the shared keeper circuit 24 to store the newly captured data.

The pulse-triggered storage element 14 captures data in response to the pulse clock signal (pulse_clk). When the pulse clock signal is active, the buffer circuit 26 of the pulse-triggered storage element 14 drives the output node of the dual-path, multimode SSE 10 with an inverted version of the input data. A buffer circuit 42 inverts signals present at the output node of the SSE 10 so that data signals output by the SSE 10 are of the correct polarity. During data capture, the shared keeper circuit 24 remains disabled in response to the active clock cycle period of the pulse clock signal, thus preventing contention between the data input and the shared keeper circuit 24. After the input data is captured by the pulse-triggered storage element 14, i.e., the data output of the SSE 10 is charged to the proper signal level, the pulse clock signal transitions to an inactive period during the present clock cycle. When the pulse clock transitions to an inactive clock cycle period, the shared keeper circuit 24 is enabled in response to the or_clk signal. Thus, the shared keeper circuit 24 stabilizes the data output of the dual-path, multimode SSE 10 by storing the data previously captured by the pulse-triggered storage element 14.

The master-slave storage element 12 captures data in response to the phase clock signal (phase_clk). During an inactive period of a particular phase clock cycle, the master stage 30 is charged to the value of the input data. That is, the transmission gate 32 of the master stage 30 enables input data to charge the master stage 32 while the transmission gate 36 of the slave stage prevents the input data from flowing to the shared keeper circuit 24. Further, the slave stage, via the shared keeper circuit 24, continues to store data previously captured by the master-slave storage element 12 during an immediately preceding phase clock cycle. When the current phase clock cycle enters an active period, the transmission gate 32 of the master stage. 30 is disabled, thus allowing the keeper circuit 34 of the master stage 30, comprising first and second buffers 44, 46 to store the captured data. The keeper circuit 34 of the master stage 30 also drives the data output of the dual-path, multimode SSE 10 with an inverted version of the input data during the active period of the phase clock cycle. When the phase clock signal is active, the shared keeper circuit 24 is disabled. As such, data stored by the slave stage during the immediately preceding phase clock cycle is overwritten with the newly captured data with minimal contention. When the phase clock transitions to an inactive period during a subsequent cycle, the shared keeper circuit 24 is once again enabled and stores the newly captured data in the slave stage.

Thus, the transmission gate 28 included in the pulse-triggered storage element 14 and the transmission gate 36 included in the slave stage of the master-slave storage element 12 function as the selector mechanism 16 of the dual-path, multimode SSE 10. The transmission gate 28 included in the pulse-triggered storage element 14 prevents data from passing between the data input and data output of the SSE 10 via the pulse-triggered storage element 14 when the pulse clock signal is inactive. Likewise, the transmission gate 36 included in the slave stage of the master-slave storage element 12 prevents data from passing between the data input and output of the SSE 10 via the master-slave storage element 12 when the phase clock signal is inactive.

The dual-path, multimode SSE 10 further includes the test multiplexer circuit 22, comprising three buffers 48-52, for enabling the SSE 10 to accommodate scan testing as previously described. Particularly, the first and second buffers 48, 50 couple the master-slave storage element 12 to a test data input when the test enable signal (test_en) is active. Conversely, the second and third buffers 50, 52 couple the master-slave storage element 12 to the functional data input when the test enable signal is inactive.

Figure 6:
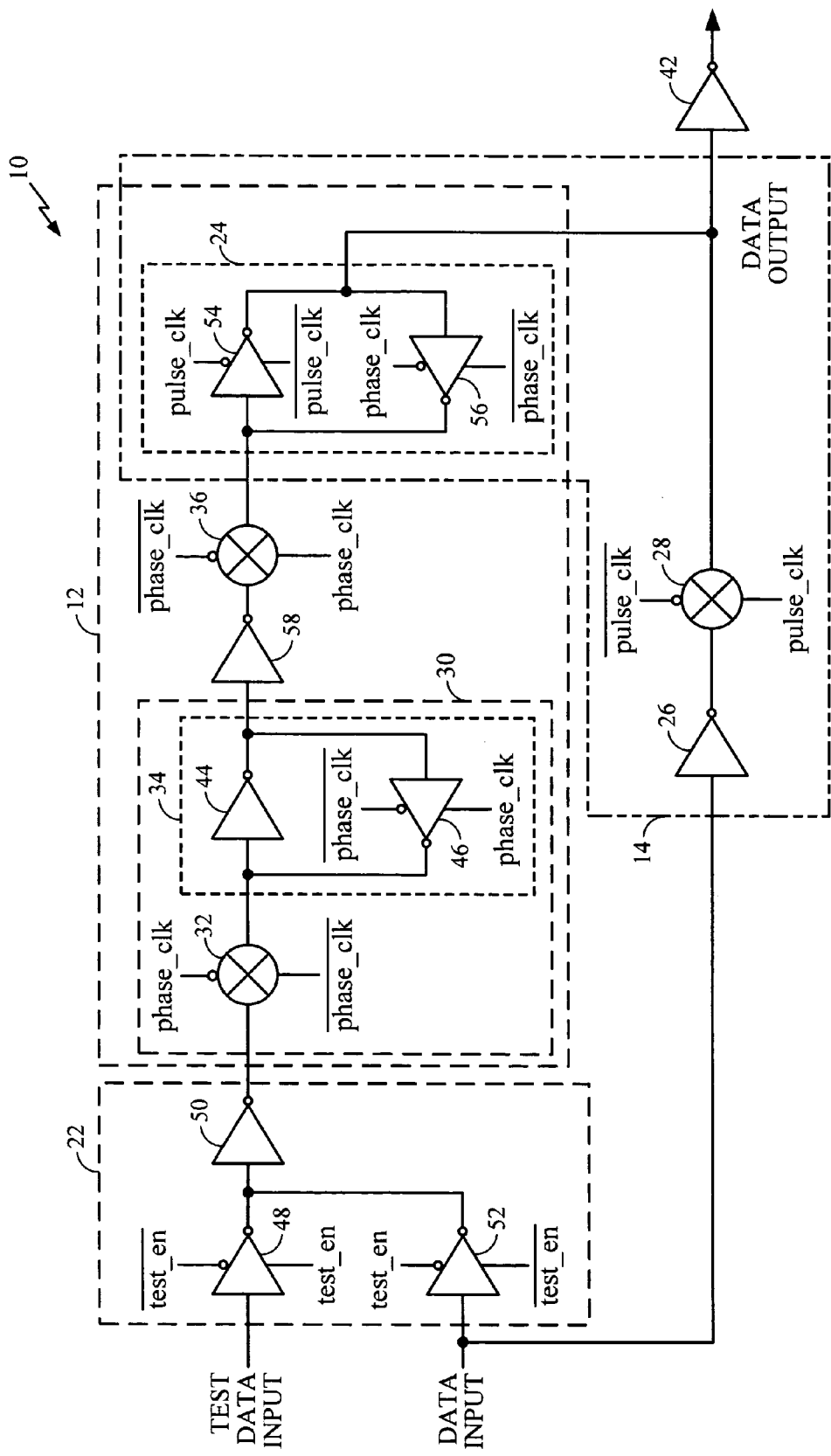
FIG. 6 is a circuit diagram of another embodiment of a dual-path, multimode SSE.

FIG. 6 illustrates another exemplary circuit implementation of the dual-path, multimode SSE 10. In this particular embodiment, the shared keeper circuit 24 comprises first and second tri-state buffers 54, 56. The first tri-state buffer 54 is placed in a high-impedance state when the pulse clock signal (pulse_clk) is active. Likewise, the second tri-state buffer 56 is placed in a high-impedance state when the phase clock signal (phase_clk) is active. Together, the tri-state buffers 54, 56 store data captured by either of the sequential storage elements 12, 14 when both the pulse and phase clock signals are inactive, e.g., after one of the storage elements 12, 14 has captured input data.

The slave stage of the SSE 10 further includes an inverter 58 that inverts signals received from the master stage 30. Although the additional inverter 58 increases the latency associated with the master-slave storage element 12, the inverter 58 ensures that the data output of the SSE 10 is of the proper polarity when the shared keeper circuit 24 comprises dual tri-state buffers 54, 56. When the shared keeper circuit 24 comprises dual tri-state buffers 54, 56, the or_clk signal no longer needs to be generated for controlling operation of the shared keeper circuit 24. Instead, the shared keeper circuit 24 is directly controlled responsive to the phase and pulse clock signals. Additionally, the performance associated with the pulse-triggered storage element 14 is improved when the shared keeper circuit 24 comprises dual tri-state buffers 54, 56 due to lower overall capacitance at the output node of the pulse triggered storage element 14.

Figure 7:
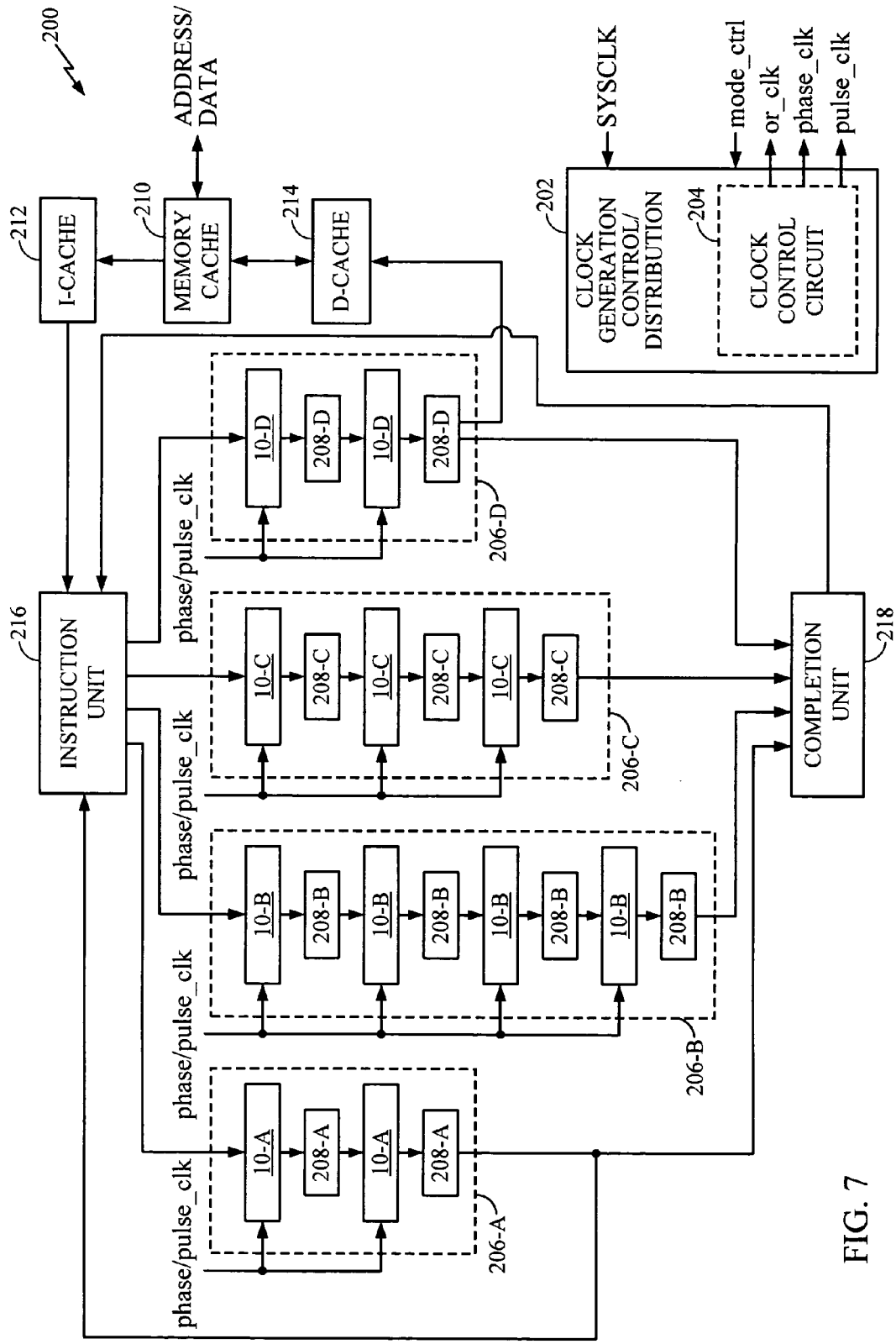
FIG. 7 is a block diagram of an embodiment of a microprocessor including dual-path, multimode SSEs.

FIG. 7 illustrates an embodiment of a microprocessor 200 including a plurality of the dual-path, multimode SSEs 10A-10D. The dual-path, multimode SSEs 10A-10D are triggered or clocked in response to either an active phase clock signal (phase_clk) or an active pulse clock signal (pulse_clk), both of which are generated by clock generation, control and distribution circuitry 202. The clock generation, control and distribution circuitry 202 manages the internal timings of the microprocessor 200 in response to an external system clock signal (SYSCLK), e.g., by generating the phase and pulse clock signals. A clock control circuit 204 included in or associated with the clock generation, control and distribution circuitry 202 activates either the pulse clock signal or the phase clock signal generated by the clock generation, control and distribution circuitry 202 in response to a mode control signal (mode_ctrl). The activated clock signal clocks or triggers the dual-path, multimode SSEs 10A-10D as previously described.

The mode control signal, which may be generated external to the microprocessor 200 or generated internally by the microprocessor 200, is set to a first state for minimizing latency and optimizing performance of the microprocessor 200 when process parameters and/or operating conditions associated with the microprocessor 200 are within acceptable limits such that pulse-triggered storage elements of the SSEs 10A-10D are expected to function reliably. For example, the mode control signal may be set to the first state for clocking the SSEs 10A-10D during normal functional operation of the microprocessor 200 or during a launch/capture stage of scan testing. Conversely, the mode control signal is set to a second state for optimizing reliability of the microprocessor 200 during timing-insensitive operations such as low power/ standby modes or during scan testing of the microprocessor 200 or when process variations and/or operating conditions are outside acceptable limits such that pulse-triggered storage elements of the SSEs 10A-10D are not expected to function reliably. Regardless of how the mode control signal is generated, the clock control circuit 204 activates one of the clock signals generated by the clock generation, control and distribution circuitry 202 and provides the activated clock signal to the dual-path, multimode SSEs 10A-10D. In one embodiment, the clock control circuit 204 also activates a signal (or_clk) for enabling respective shared keeper circuits of the dual-path, multimode SSEs 10A-10D during inactive clock cycle periods of the phase and pulse clock signals to minimize contention as previously described.

In operation, the microprocessor 200 retrieves instructions and corresponding data from external memory (not shown). The microprocessor 200 executes the instructions and stores results to the external memory. In a non-limiting example, the microprocessor 200 includes a plurality of pipelines 206A-206D for executing instructions. Each pipeline 206A-206D includes a plurality of stages including combinatorial logic 208A-208D for executing an instruction or part of an instruction. The stages are separated by inter-stage, dual-path sequential storage elements such as the dual-path, multimode SSEs 10A-10D. The dual-path, multimode SSEs 10A-10D capture data from previous pipeline stages and/or launch data to succeeding stages in response to an activated clock signal as provided by the clock control circuit 204.

In one embodiment, a memory cache 210, e.g., a level-2 cache, stores address and data information retrieved from external memory via bus interface logic (not shown) of the microprocessor 200. The memory cache 210 forwards instruction information to an instruction cache 212 and forwards data to and receives data from a data cache 214. An instruction unit 216 provides centralized control of instruction flow to the pipelines 206A-206D of the microprocessor 200. A completion unit 218 tracks processing of instructions from dispatch by the instruction unit 216 through execution by the pipelines 206A-206D. Each pipeline 206A-206D executes instructions received from the instruction unit 216 in stages. In a non-limiting example, a branch pipeline 206A includes two stages of combinatorial logic 208A for executing an instruction, a floating point pipeline 206B includes four stages of combinatorial logic 208B, an integer pipeline 206C includes three stages of combinatorial logic 208C, and a load/store pipeline 206D includes two stages of combinatorial logic 208D. Those skilled in the art will appreciate that the microprocessor 200 may be superpipelined and/or superscalar. As such, the microprocessor 200 may include a multitude of pipelines for executing instructions where each pipeline may include several stages separated by various instances of the dual-path, multimode SSE 10.

Figure 8:
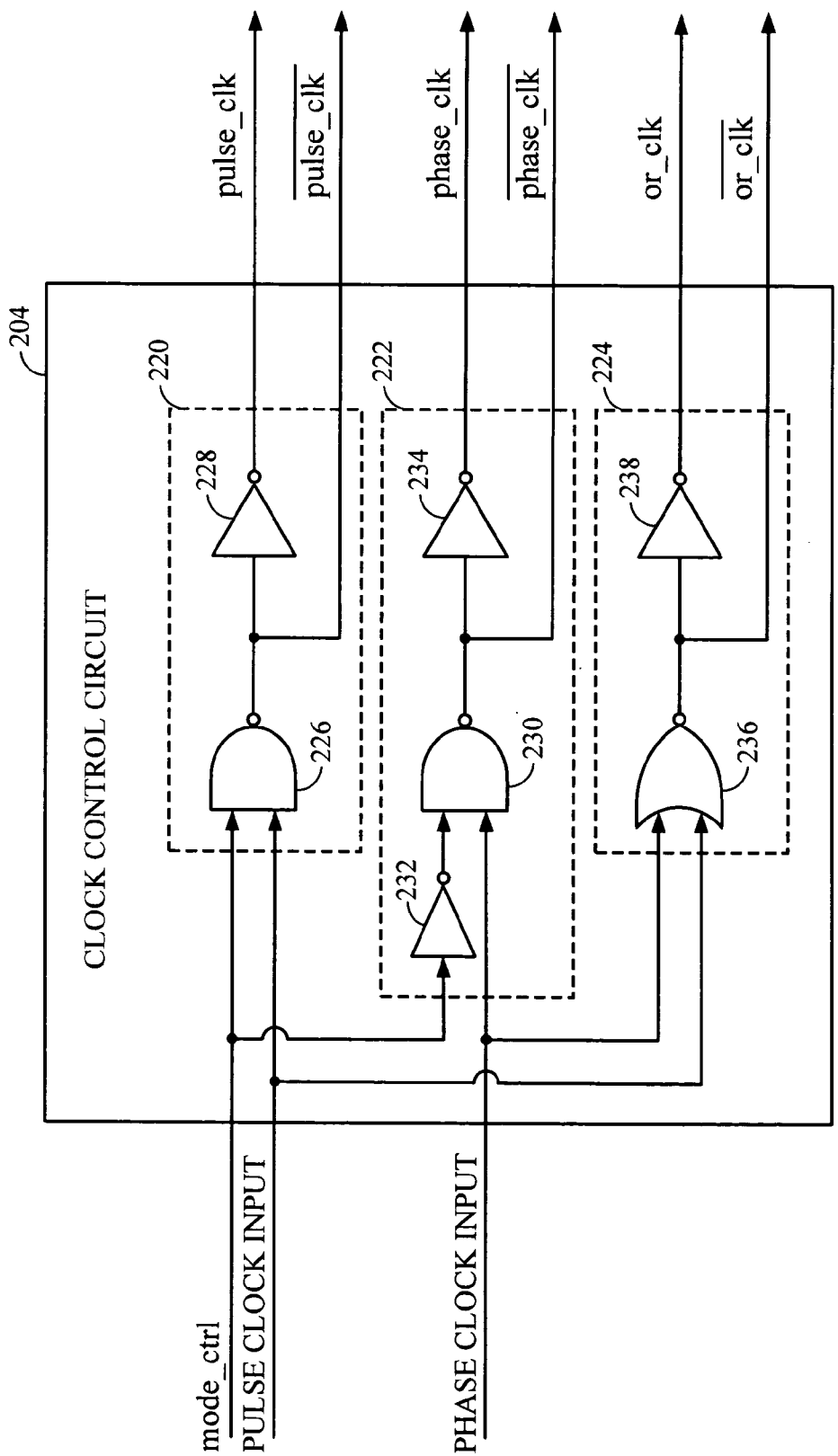
FIG. 8 is a block diagram of an embodiment of a clock control circuit for use with a dual-path, multimode SSE.
Figure 9:
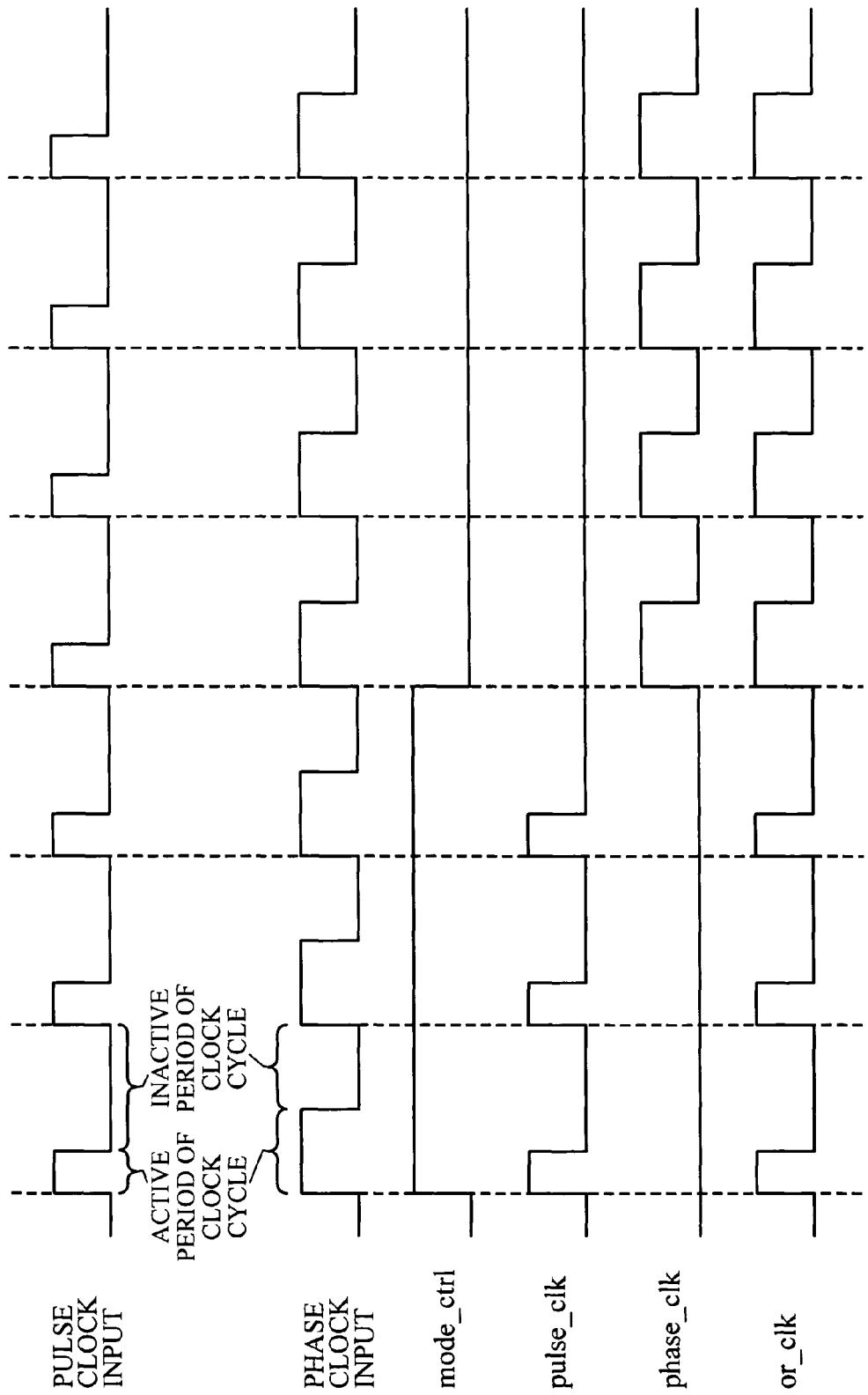
FIG. 9 is a timing diagram illustrating various signals generated by a dual-path, multimode SSE.

FIG. 8 illustrates an embodiment of the clock control circuit 204 included in or associated with the clock generation, control and distribution circuitry 202 of the microprocessor 200. The clock control circuit 204 is next described with reference to FIG. 9, which illustrates timing relationships of various signals activated or generated by the clock control circuit 204 in response to the mode control signal (mode_ctrl). The clock control circuit 204 includes a first circuit 220 for activating a pulse clock signal (pulse_clk), a second circuit 222 for activating a phase clock signal (phase_clk) and a third circuit 224 for generating a signal (or_clk) that disables the shared keeper circuit 24 of the dual-path, multimode SSE 10 when the shared keeper circuit 24 comprises one tri-state buffer as illustrated in FIG. 5.

The first circuit 220 comprises a NAND logic gate 226 and a buffer 228. When the mode control signal is in a first state, the first circuit 220 activates the pulse clock input generated by the clock generation, control and distribution circuitry 202 of the microprocessor 200 by outputting a pulse clock signal (pulse_clk) and an inverted version of the pulse clock signal. The activated pulse clock signals control the transmission gates of the dual-path, multimode SSE 10 as previously described. The second circuit 222 comprises a NAND logic gate 230 and two buffers 232, 234. When the mode control signal is in a second state, the second circuit 222 activates the phase clock input generated by the clock generation, control and distribution circuitry 202 of the microprocessor 200 by outputting a phase clock signal (phase_clk) and an inverted version of the phase clock signal. The activated phase clock signals control the transmission gates of the dual-path, multimode SSE 10 as previously described. The first and second circuits 220, 222 prevent both the phase and pulse clock signals from being active at the same time. As such, only one path of the dual-path, multimode SSE 10 is enabled to store data.

The third circuit 224 comprises a NOR logic gate 236 and a buffer 238. The third circuit 224 generates a signal (or_clk) and an inverted version of the signal for enabling or disabling the shared keeper circuit 24 of the dual-path, multimode SSE 10 in response to the phase and pulse clock inputs when the shared keeper circuit 24 comprises one tri-state buffer as illustrated in FIG. 5. As such, when either of the phase or pulse clock inputs generated by the clock generation, control and distribution circuitry 202 of the microprocessor 200 have an active clock cycle period, the shared keeper circuit 24 is disabled in response to the signals generated by the third circuit 224, thus minimizing contention as previously described. Conversely, when both of the phase and pulse clock inputs have an inactive clock cycle period or are deactivated, the shared keeper circuit 24 is enabled, thus storing data captured by either the master-slave storage element 12 or the pulse-triggered storage element 14 of the dual-path, multimode SSE 10.

With the above range of variations and applications in mind, it should be understood that the present disclosure is not limited by the foregoing description, nor is it limited by the accompanying drawings. Instead, the present disclosure is limited only by the following claims and their legal equivalents.

What is claimed is:

1. An apparatus for storing data, comprising:
    a first sequential storage element having an input and an output, wherein the first sequential storage element comprises a pulse-triggered storage element responsive to a pulse clock;
    a second sequential storage element having an input and an output, wherein the second sequential storage element comprises a master-slave storage element responsive to a phase clock;
    wherein the master slave storage element latches data through more sequential latch stages during a cycle of the phase clock than the pulse-triggered storage element during a cycle of the pulse clock;
    a data input coupled to the first sequential storage element input and to the second sequential storage element input, the data input configured to accept data;
    a data output coupled to the first sequential storage element output and to the second sequential storage element output; and
    a selector mechanism configured to select the first sequential storage element or the second sequential storage element to pass the data from the data input to the data output.

2. The apparatus of claim 1, wherein the selector mechanism comprises a selector circuit interposed between the outputs of the first and second sequential storage elements and the data output.

3. The apparatus of claim 1, wherein the selector mechanism comprises a first transmission gate interposed between the output of the first sequential storage element and the data output and a second transmission gate interposed between the output of the second sequential storage element and the data output.

4. The apparatus of claim 1, wherein the pulse-triggered storage element and a slave stage of the master-slave storage element share a keeper circuit configured to store the data.

5. The apparatus of claim 4, wherein the selector mechanism comprises a first transmission gate interposed between a buffer circuit of the pulse-triggered storage element and the shared keeper circuit and a second transmission gate interposed between a master stage of the master-slave storage element and the shared keeper circuit.

6. The apparatus of claim 5, wherein the data output is arranged in a wired-OR configuration connecting an output of the first transmission gate and an output of the second transmission gate to the shared keeper circuit.

7. The apparatus of claim 5, wherein the first transmission gate is configured to select the pulse-triggered storage element responsive to a pulse clock signal and the second transmission gate is configured to select the master-slave storage element responsive to a phase clock signal.

8. The apparatus of claim 7, wherein the shared keeper circuit is enabled responsive to each of the clock signals having an inactive clock cycle period and is disabled responsive to one of the clock signals having an active clock cycle period.

9. The apparatus of claim 4, wherein the shared keeper circuit comprises a buffer and a tri-state buffer coupled in parallel.

10. The apparatus of claim 4, wherein the shared keeper circuit comprises two tri-state buffers coupled in parallel.

11. The apparatus of claim 1, further comprising a circuit configured to pass test data to the master-slave storage element when enabled in a test mode and to pass functional data to the master-slave storage element when enabled in a non-test mode.

12. A microprocessor, comprising:
    a clock control circuit configured to activate a pulse clock signal or a phase clock signal; and
    a plurality of pipelines, each pipeline having a plurality of stages separated by inter-stage dual-path multimode sequential storage elements, each dual-path multimode sequential storage element comprising:
        a master-slave storage element having an input and an output, the master-slave storage element responsive to the phase clock signal;
        a pulse-triggered storage element having an input and an output, the pulse-triggered storage element responsive to the pulse clock signal;
        a data input coupled to the master-slave storage element input and to the pulse-triggered storage element input, the data input configured to accept data;
        a data output coupled to the master-slave storage element output and to the pulse-triggered storage element output; and
        a selector mechanism configured to select the master-slave storage element or the pulse-triggered storage element to pass the data from the data input to the data output responsive to the clock signal activated by the clock control circuit;
    wherein the master slave storage element latches data through more sequential latch stages during a cycle of a phase clock than the pulse-triggered storage element during a cycle of a pulse clock.

13. The microprocessor of claim 12, wherein the pulse-triggered storage element and a slave stage of the master-slave storage element share a keeper circuit configured to store the data.

14. The microprocessor of claim 13, wherein the selector mechanism comprises a first transmission gate interposed between a buffer circuit of the pulse-triggered storage element and the shared keeper circuit and a second transmission gate interposed between a master stage of the master-slave storage element and the shared keeper circuit.

15. The microprocessor of claim 14, wherein the data output is arranged in a wired-OR configuration connecting an output of the first transmission gate and an output of the second transmission gate to the shared keeper circuit.

16. The microprocessor of claim 14, wherein the first transmission gate is configured to select the pulse-triggered storage element responsive to the pulse clock signal and the second transmission gate is configured to select the master-slave storage element responsive to the phase clock signal.

17. The microprocessor of claim 13, wherein the shared keeper circuit is enabled responsive to each of the clock signals having an inactive clock cycle period and is disabled responsive to one of the clock signals having an active clock cycle period.

18. The microprocessor of claim 12, wherein each dual-path, multimode sequential storage element further comprises a circuit configured to pass test data to the master-slave storage element when the microprocessor is enabled in a test mode and to pass functional data to the master-slave storage element when the microprocessor is enabled in a non-test mode.

19. A method of storing data, comprising:
  selecting one of a master-slave storage element and a pulse-triggered storage element coupled in parallel responsive to a mode input, wherein the master-slave storage element is responsive to a phase clock and the pulse-triggered storage element is responsive to a pulse clock; and
  passing data from a data input to a data output via the selected storage element;
  wherein the master slave storage element latches the data through more sequential latch stages during a cycle of the phase clock than latched by the pulse-triggered storage element during a cycle of the pulse clock.

20. The method of claim 19, further comprising selecting the master-slave storage element responsive to the mode input being in a first state and selecting the pulse-triggered storage element responsive to the mode input being in a second state.

21. The method of claim 20, further comprising:
  disabling the master-slave storage element responsive to the mode input being in the second state; and
  disabling the pulse-triggered storage element responsive to the mode input being in the first state.

22. The method of claim 20, further comprising, in response to the mode input being in the first state, passing test data to the master-slave storage element during testing and passing functional data to the master-slave storage element during normal functional operation.

23. The method of claim 19, further comprising enabling a transmission gate of the pulse-triggered storage element responsive to the mode input being in a first state and enabling a transmission gate of the master-slave storage element responsive to the mode input being in a second state.

24. The method of claim 23, further comprising:
  activating a pulse clock signal responsive to the mode input being in the first state; and
  activating a phase clock signal responsive to the mode input being in the second state.

25. The method of claim 24, wherein enabling the transmission gate of the pulse-triggered storage element comprises providing the pulse clock signal to the transmission gate of the pulse-triggered storage element and enabling the transmission gate of the master-slave storage element comprises providing the phase clock signal to the transmission gate of the master-slave storage element.

26. The method of claim 24, further comprising stabilizing the data output responsive to the clock signals.

27. The method of claim 26, wherein stabilizing the data output comprises:
  enabling a keeper circuit shared by the storage elements responsive to each of the clock signals having an inactive clock cycle period; and
  disabling the shared keeper circuit responsive to one of the clock signals having an active clock cycle period.

* * * * *